(12) United States Patent
Patterson et al.

(10) Patent No.: US 7,772,866 B2
(45) Date of Patent: Aug. 10, 2010

(54) STRUCTURE AND METHOD OF MAPPING SIGNAL INTENSITY TO SURFACE VOLTAGE FOR INTEGRATED CIRCUIT INSPECTION

(75) Inventors: Oliver D. Patterson, Poughkeepsie, NY (US); Horatio Seymour Wildman, Wappingers Falls, NY (US); Min-Chul Sun, Gyeonggi-do (KR)

(73) Assignees: International Business Machines Corporation, Armonk, NY (US); Samsung Electronics Co., Ltd., Gyeonggi-Do (KR)

( * ) Notice: Subject to any disclaimer, the term of this patent is extended or adjusted under 35 U.S.C. 154(b) by 439 days.

(21) Appl. No.: 11/683,058

(22) Filed: Mar. 7, 2007

(65) Prior Publication Data

US 2008/0217612 A1 Sep. 11, 2008

(51) Int. Cl.
*G01R 31/02* (2006.01)
(52) U.S. Cl. ..................................................... 324/763
(58) Field of Classification Search ............... 324/765, 324/158.1, 537, 500, 763; 327/503, 538
See application file for complete search history.

(56) References Cited

U.S. PATENT DOCUMENTS

| 6,265,890 | B1 | 7/2001 | Chacon | |
| 6,300,785 | B1 * | 10/2001 | Cook et al. | 324/765 |
| 6,825,649 | B2 | 11/2004 | Nakano | |
| 6,930,503 | B2 * | 8/2005 | Sher et al. | 324/765 |
| 6,963,214 | B2 * | 11/2005 | Huang et al. | 324/765 |

* cited by examiner

*Primary Examiner*—Ha Tran T Nguyen
*Assistant Examiner*—Tung X Nguyen
(74) *Attorney, Agent, or Firm*—Yuanmin Cai

(57) ABSTRACT

Embodiments of the present invention provide a test structure for inspection of integrated circuits. The test structure may be fabricated on a semiconductor wafer together with one or more integrated circuits. The test structure may include a common reference point for voltage reference; a plurality of voltage dropping devices being connected to the common reference point; and a plurality of electron-collecting pads being connected, respectively, to a plurality of contact points of the plurality of voltage dropping devices. A brightness shown by the plurality of electron-collecting pads during an inspection of the integrated circuits may be associated with a pre-determined voltage.

20 Claims, 6 Drawing Sheets

STRUCTURE AND METHOD OF MAPPING SIGNAL INTENSITY TO SURFACE VOLTAGE FOR INTEGRATED CIRCUIT INSPECTION

FIELD OF THE INVENTION

The present invention relates generally to the manufacturing of semiconductor devices. More specifically, it relates to methods and structures used in mapping a signal intensities measured during inspection of integrated circuit to surface voltages of semiconductor devices on a semiconductor wafer.

BACKGROUND OF THE INVENTION

In the field of integrated circuit manufacturing, it is well known in the art that in order to create semiconductor devices of various functionalities on a semiconductor substrate, the substrate will generally go through, at different stages, various chemical and mechanical processing. Such processing may include, for example, ion implantation and/or doping, chemical vapor deposition, isotropic and/or anisotropic etching, chemical-mechanical-polishing, etc. The processing may produce devices such as, for example, field-effect-transistor (FET), electronic fuse, random access memory (RAM), etc. In order to ensure integrity of the functionalities of various final products fabricated in a semiconductor wafer, which in general contains a plurality of semiconductor devices, non-destructive and/or in-situ testing at different processing stages is essential and generally preferred. A non-destructive in-site testing may timely provide vital information on processing conditions that may need to be adjusted during the course of manufacturing in order to control the quality of the final products, and to monitor possible development of device defects.

Non-destructive and/or in-site testing may be conducted directly on semiconductor devices in a wafer under development. Alternatively, it may be performed in one or more designated testing areas or testing strips on the same wafer whereupon the semiconductor devices are commonly produced. A testing strip may include one or more test structures embedded in between the semiconductor devices in order to closely resemble processing conditions experienced by the semiconductor devices. It is also conceivable that a test strip may be formed in a wafer different from that of the semiconductor devices but the test strip is placed closely to the wafer of the semiconductor devices during manufacturing and testing. On the other hand, among various non-destructive testing there is a surface voltage testing mechanism, which measures device parameters that may be used as a general indication as to the quality of electrical nodes and/or contacts often found in various semiconductor devices.

Currently, surface voltage testing is generally conducted by a Kelvin probe. Kelvin probe is a non-contact, non-destructive measurement device used to investigate properties of materials. A Kelvin probe, based on a vibrating capacitor, generally measures a difference in work functions (or for non-metals surface potentials) between a conducting specimen and a vibrating tip. The work function is extremely sensitive to the surface conditions and thus its reading may be adversely affected by, for example, absorbed or evaporated layers, surface reconstruction, surface charging, oxide layer imperfections, surface and bulk contamination, etc., to list a few. Because the work function is so sensitive, it is sometimes difficult to make proper differentiation and/or judgment between a voltage difference caused by actual conditions of the semiconductor device under test and that caused by changes in one or more of the many affecting factors.

Therefore, there exists a need in the relevant art to develop an effective non-destructive method for measuring surface voltage for device inspection during semiconductor device manufacturing.

SUMMARY OF THE INVENTION

Embodiments of the present invention provide a test structure fabricated together with one or more integrated circuits on a semiconductor wafer. The test structure may include a common reference point for voltage reference; one or more voltage dropping devices connected to the common reference point; and one or more electron-collecting pads connected to one or more contact points of the voltage dropping devices. A brightness shown by the one or more electron-collecting pads during an inspection of the integrated circuits may be associated with or mapped to a pre-determined voltage. The common reference point may be, for example, a ground point which has a known fixed voltage, such as zero, during the inspection of the integrated circuits.

According to one embodiment, the voltage dropping devices may be a group of diodes with the contact points being the anode thereof. The group of diodes may be connected in a series with the cathode of a diode being connected to the anode of a preceding diode. The first diode in the series may be connected to the common reference point.

According to another embodiment, the voltage dropping devices may be a group of transistors with a gate of the transistors being connected to either a source or a drain of said transistors, depending on the type of the transistors. The transistors may have a pre-defined or pre-determined voltage drop from the source to the drain during operation. Furthermore, the transistors may be connected in a series with the drain of a transistor being connected to the source of an adjacent transistor.

Embodiments of the present invention also provide a test structure formed or fabricated upon a semiconductor wafer having one or more integrated circuits. The test structure may include a common reference point for voltage reference; a plurality of voltage dropping devices having respectively a first and a second contact point with the first contact point being associated with the common reference point. The voltage dropping devices may be adapted to hold up to a certain pre-determined value of voltages between the first and second contact points respectively, and a plurality of conductive pads being connected to the second points of the voltage dropping devices respectively. The conductive pads may be adapted to hold electronic charges during an inspection of the integrated circuits.

According to one embodiment, the plurality of voltage dropping devices may be a group of semiconductor diodes, with the first contact point being the anode and the second contact point being the cathode, connected in a series with the cathode of a diode being connected to the anode of a neighboring diode except that the first diode in the series is connected to the common reference point.

According to another embodiment, the plurality of voltage dropping devices may be a group of transistors with a gate being connected to a source or a drain depending on the type of the transistors. The transistors have a pre-determined voltage drop from the source to the drain during operation. The group of transistors may be connected in a series with the drain of a transistor being connected to the source of an adjacent transistor.

Embodiments of the present invention may further provide a structure that includes a substrate having a ground point; a plurality of semiconductor devices having respectively first and second contact points; and the first contact points being associated with the ground point. The semiconductor devices may be adapted to hold, up to a pre-determined set of values of, voltages between the first and second contact points. A plurality of conductive pads may be connected to the second contact points of the semiconductor devices respectively, and may be adapted to collect electronic charges during an inspection of one or more integrated circuits.

BRIEF DESCRIPTION OF THE DRAWINGS

The present invention will be understood and appreciated more fully from the following detailed description of the invention, taken in conjunction with the accompanying drawings of which.

Figure 1:
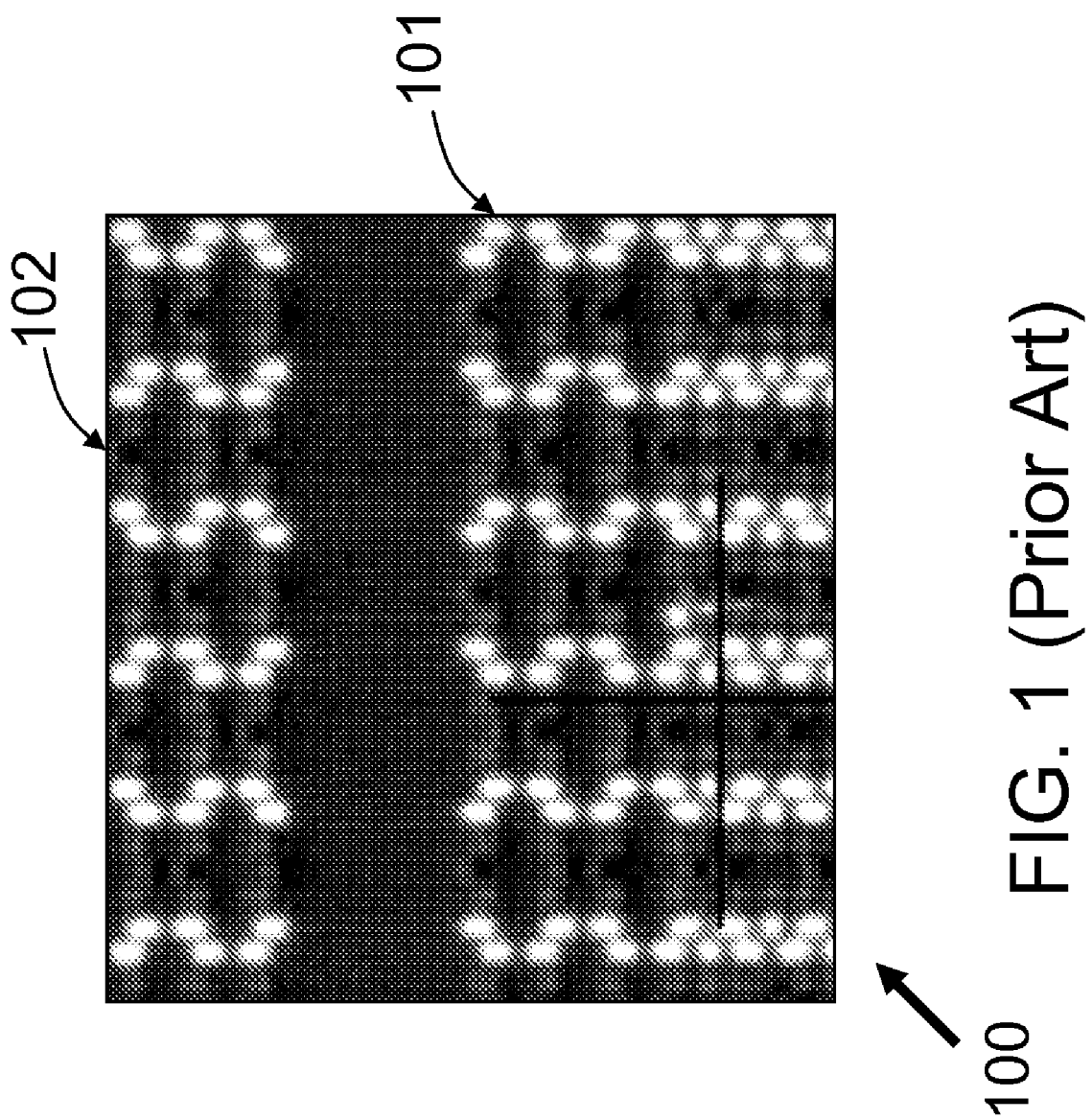
FIG. 1 is a sample SEM image of a SRAM array as is known in the prior art.

It will be appreciated by a person skilled in the art that for simplicity reason and for clarity of illustration, elements shown in the drawings have not necessarily been drawn to scale. For example, dimensions of some of the elements may be exaggerated relative to other elements for clarity purpose.

DETAILED DESCRIPTION OF THE INVENTION

In the following detailed description, numerous specific details are set forth in order to provide a thorough understanding of embodiments of the invention. However, it will be understood by those of ordinary skill in the art that embodiments of the invention may be practiced without these specific details. In other instances, well-known methods and procedures have not been described in detail so as not to obscure the embodiments of the invention.

In the following description, various figures, diagrams, flowcharts, models, and descriptions are presented as different means to effectively convey the substances and illustrate different embodiments of the invention that are proposed in this application. It shall be understood by those skilled in the art that they are provided merely as exemplary samples, and shall not be constructed as limitation to the invention.

As is generally known in the art, a scanning electron microscope (SEM) may be used in a voltage contrast inspection. Under electron extraction conditions, because electron emission from an electrical node, such as a contact or a metal runner, is in general a function of the potential of that node or node structure, a grounded structure usually appears bright and a floating structure appears dark. FIG. 1 is a sample SEM image of a static random access memory (SRAM) array. This SRAM array image 100 was taken after being tungsten (W) chemical-mechanical-polished (WCMP) as is known in the art. Image 100 shows that various contacts (e.g., contact 101) that land on one or more p-type field-effect-transistors (PFETs) are grounded and therefore appear relatively bright, while other contacts (e.g., contact 102) that land on one or more n-type field-effect-transistors (NFETs) are floating and therefore appear relatively dark. In general, the type of material used for the devices may also affect or influence the electron emission and thus cause the relative brightness observed in the SEM image to vary. However, because a pattern of brightness is usually compared to an exact copy of itself, this influence in brightness is a non-factor for the purpose of inspection.

The exact intensity or brightness of a floating structure, such as a node, varies with the actual potential or voltage of the node. The higher the voltage, the darker the node usually appears. During inspection of integrated circuits, there are many instances where it would be beneficial to know at least the approximate surface voltage of the node so as to know whether a contact on the node is open or short. This is because certain defects may not cause absolute opens or shorts and instead may show resistive characteristics. Knowing surface voltages on either side of a defect may enable the resistance associated therewith to be properly determined or estimated. In another example, surface voltage may be used to determine performance characteristics of a transistor. In yet another example, information on surface voltage may be used to calibrate a model of the voltage contrast process which could be used to select the optimal conditions for different inspections.

As is described below further in details, embodiments of the present invention provides a test structure that may include a set of electronic devices such as, for example, semiconductor diodes (or transistors) with approximately the same pre-defined or pre-determined voltage drops. The set of electronic devices may be arranged in a series to form a set of electrical testing nodes with known voltages. According to another embodiment of the present invention, a set of electronic devices with different and incremental pre-defined or pre-determined voltage drops may be arranged in parallel, with a common voltage reference point, to form a set of electrical testing nodes. The test structure, having the set of electrical testing nodes, may be formed in a testing area or testing strip preferably created in a wafer common to the semiconductor devices under test. Alternatively, the test structure may also be formed in a wafer separate and different from the wafer containing the semiconductor devices. During a SEM voltage contrast inspection, the signal intensity detected at a contact or node of a semiconductor device may be mapped to a corresponding surface voltage by referring to a map generated from a set of signal intensities associated with the set of electrical testing nodes formed in the testing area or testing strip. In situations where the test structure is formed in a wafer different from that of the semiconductor devices, the test structure may be placed in close proximity to the wafer having the semiconductor devices during the device manufacturing process such that the test structure may experience similar processing conditions as those of the semiconductor devices.

Figure 2:
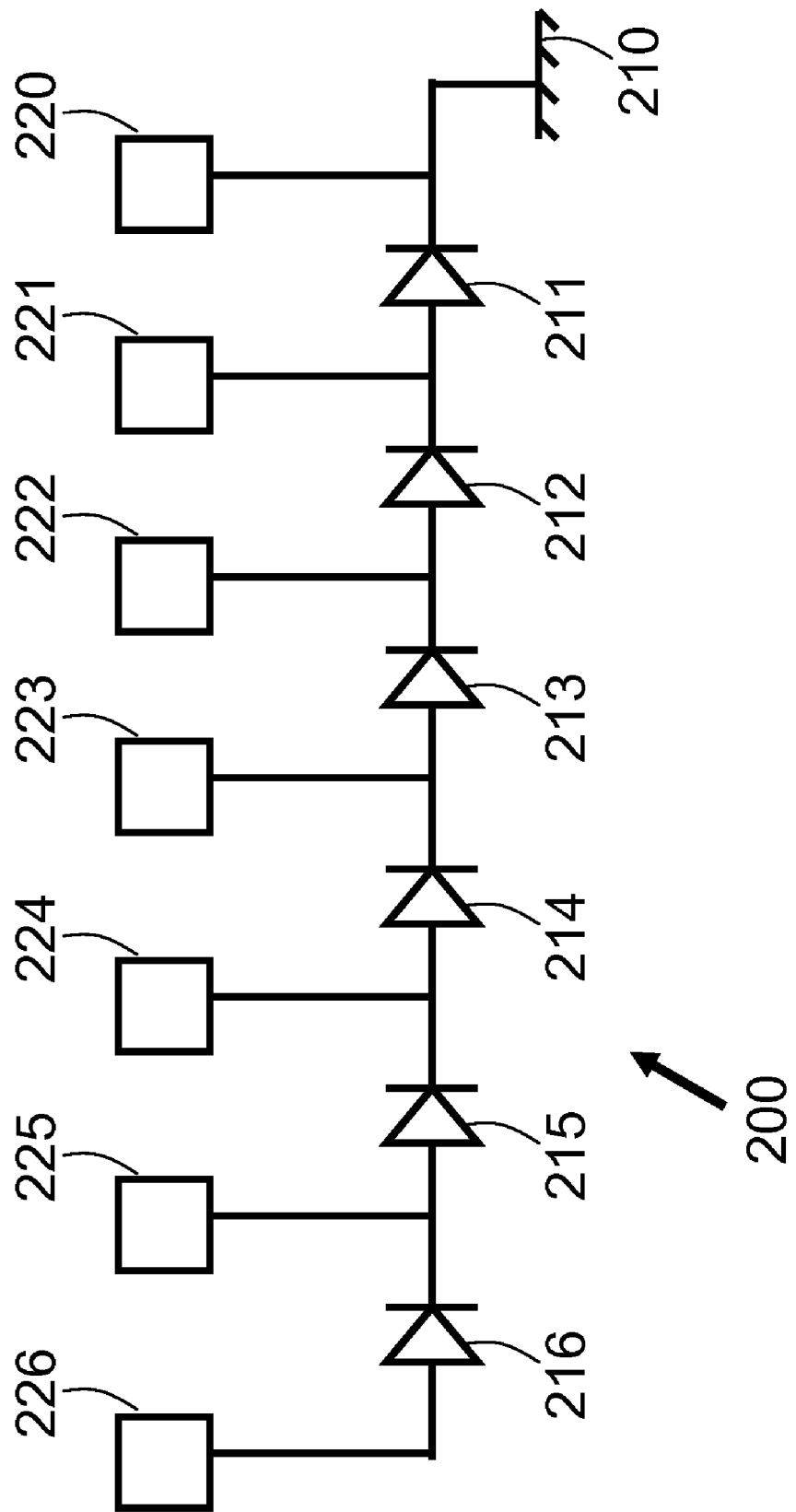
FIG. 2 is a demonstrative illustration of a test structure according to one embodiment of the present invention.

FIG. 2 is a demonstrative illustration of a test structure according to one embodiment of the present invention. Test structure 200 may be used to properly determine the surface voltage of a node of resistive characteristics. Test structure 200 may include a set of voltage dropping devices such as, for example, semiconductor diodes 211, 212, 213, 214, 215 and 216 that are connected in a series and ultimately to a common reference point 210. More specifically, the anode of one diode, e.g., diode 213, may be connected to the cathode of the next diode, e.g., diode 214. In other words, the cathode of diode 214 may be connected to the anode of the preceding diode 213. Cathode of the first diode in the series, i.e., diode 211, may be connected to the common reference point 210, which may be a ground point 210. Connection to common reference point 210 may provide a voltage reference point for the diode series.

Preferably, diodes 211, 212, 213, 214, 215 and 216 may be fabricated from a substantially same semiconductor material; have a substantially same structure; and thus a substantially same voltage drop, which in this case may be the bias voltage (threshold voltage) across their respective p-n junctions, during operation. (Throughout this application, the term "substantially" or "approximately" may be applied to modify any quantitative representation which could permissibly vary without resulting in a change in the basic function to which it is related). For example, semiconductor diode 211, and other semiconductor diodes 212-216, may be formed to have a bias voltage of approximate 0.6V across its p-n junction. However the present invention is not limited in this respect and diodes with other bias voltages, ranging from 0.3V to 0.8V for example, may be used as well. The change in bias voltage may depend on the types of dopants and the doping concentration used during the fabrication of the semiconductor diodes.

Test structure 200 may also include a set of pads 220, 221, 222, 223, 224, 225 and 226, of substantially the same sizes and shapes, connected to the anodes of their respective diodes 211, 212, 213, 214, 215 and 216 except for the first pad 220, which may be connected directly to common reference point 210. Pads 220-226 may be made of conductive or semi-conductive materials such as, for example, nickel silicide (NiSi) and may be used to collect electrons, during a voltage contrast inspection using SEM. For that reason, pads 220-226 may be referred to as "electron-collecting pad" or "conductive pad" throughout this application. During a voltage contrast inspection of semiconductor devices, an electron-collecting pad, e.g., pad 223, may be able to collect electrons until a voltage potential created by the accumulatively collected electrons is either clamped by a threshold voltage of the semiconductor diode, e.g., diode 213 to which pad 223 is connected, or limited by a leakage current associated with pad 223. For example, if pad 223 has a sufficiently low leakage current, the voltage potential that may be held by pad 223 will be mainly limited by the threshold voltage that turns diode 213 on, which will be equal to the accumulative voltage drops across diode 213 and all the preceding diodes 211 and 212. Further for example, if the bias voltage of a single diode is 0.6V, electron-collecting pad 221 may be charged up to 0.6V; electron-collecting pad 222 may be up to 1.2V; electron-collecting pad 223 may be up to 18V, etc. The chain of semiconductor diodes 211-216 thus may provide a granularity of 0.6V for voltage detection.

It shall be noted that a person skilled in the art may appreciate that although a set of six (6) semiconductor diodes and a set of six (6) corresponding electron-collecting pads are illustrated in FIG. 2, the present invention is not limited in this respect and other number of diodes and pads, other than six (6), may be used as well. A person skilled in the art may also appreciate that, depending on the range of interest in the voltage under detection, some of the diodes may not necessarily have electron-collecting pads connected thereto. Also, as described above, the electron-collecting pads 220-226 may have any other suitable shapes and the rectangular shape shown in FIG. 1 is for illustration purpose.

Figure 3:
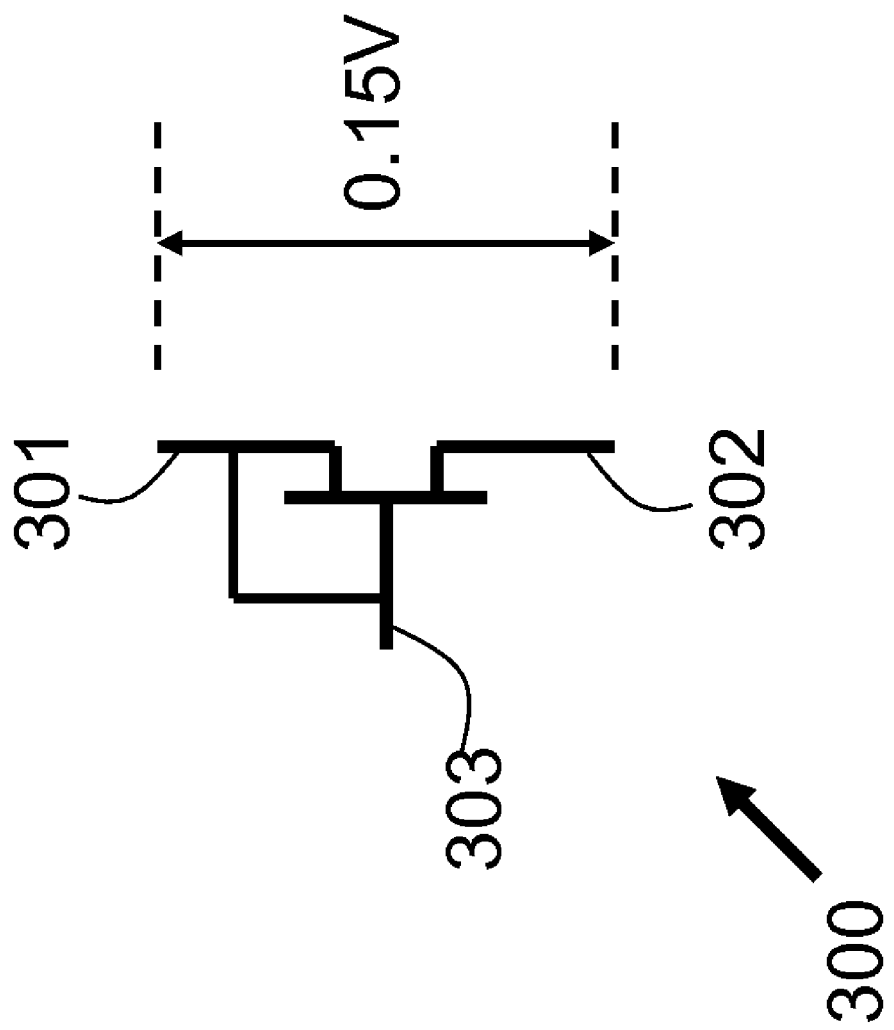
FIG. 3 is a demonstrative illustration of a transistor structure having a pre-determined voltage drop from a source to a drain and is suitable for embodiments of the present invention.

In FIG. 2, a set of voltage drops that may be held by electron-collecting pads 221-226 is illustrated to be provided by a set of cascaded semiconductor diodes 211-216. However, the present invention is not limited in this respect. Other voltage dropping devices may be used in replacement of diode 211-216. For example, FIG. 3 is a demonstrative illustration of a transistor 300 such as, for example, a field-effect-transistor (FET) with its source 301 and gate 303 connected together. Transistor 300 may provide a pre-defined or pre-determined voltage drop, for example 0.15V, from source 301 to drain 302 during operation. Transistor 300 may be used to replace one or more diodes 211-216 as shown in FIG. 2. The relatively small voltage drop of around 0.15V from source 301 to drain 302, compared with 0.6V of the semiconductor diodes 211-216 shown in FIG. 2, may provide a better granularity and/or higher resolution during a voltage contrast inspection of semiconductor devices.

Electron-collecting pads 221-226 and semiconductor diodes 211-216 may be manufactured at a same metal level or different metal levels during the process of semiconductor manufacturing. If being manufactured or formed at different metal levels, electron-collecting pads 221-226 may be connected to the anodes of their respective semiconductor diodes 211-216 through inter-connect structures built into inter-level dielectric (ILD) layers. Inter-connect structures between different metal levels and process of forming the same are well known in the art and therefore are not described here for clarity purpose.

During voltage contrast inspection using SEM, electrons may accumulate on structures such as contacts and/or metal runners, for example a node which may be grounded, semi-grounded, or floating, of semiconductor devices. In the mean time, electrons may also accumulate on one or more electron-collecting pads in a test structure according to embodiments of the present invention. As is shown in the SEM image of FIG. 1, usually a grounded structure appears bright and a floating structure appears dark. The brightness shown in the SEM image of FIG. 1 may reflect a particular voltage relating to a particular point or element under test. According to one embodiment of the present invention, the brightness of a particular element under test may be compared to those of the electron-collecting pads in the test structure. For example, in an inspection after the gate stack formation, the element under test may be a gate or active region. At the contact levels, the element under test may be different contacts. At a metal level, the element under test may be different metal elements. Since voltages supported by each individual electron-collecting pads are associated by the diodes that they are connected to and so the values of the voltages are pre-defined or pre-determined, the brightness of the contact under test may be associated to a particular voltage. The comparison of brightness may be conducted visually for relatively coarse granularity, or through other advanced techniques for better granularity. For example, a computer system may be configured or programmed to compare the brightness of pixels based on their corresponding grey scales. The grey scales may be represented by a range of numerical figures, for example, from 1 to 1024. Furthermore, for example, assuming the brightness of an electron-collecting pad having a surface voltage 0.6V is represented by a numerical grey scale 213, any pixels in the detected image from the circuit of interest having the same numerical grey scale 213 may indicates a surface voltage of 0.6V. It shall be noted that at some stages of the device manufacturing, for example, at a stage after the gate stack formation, the surface may contain or be covered by different conductive materials (e.g. a poly gate and crystalline silicon active regions), which may cause certain variation in the brightness of the circuit under test. Therefore, some brightness calibration may be needed.

Figure 4:
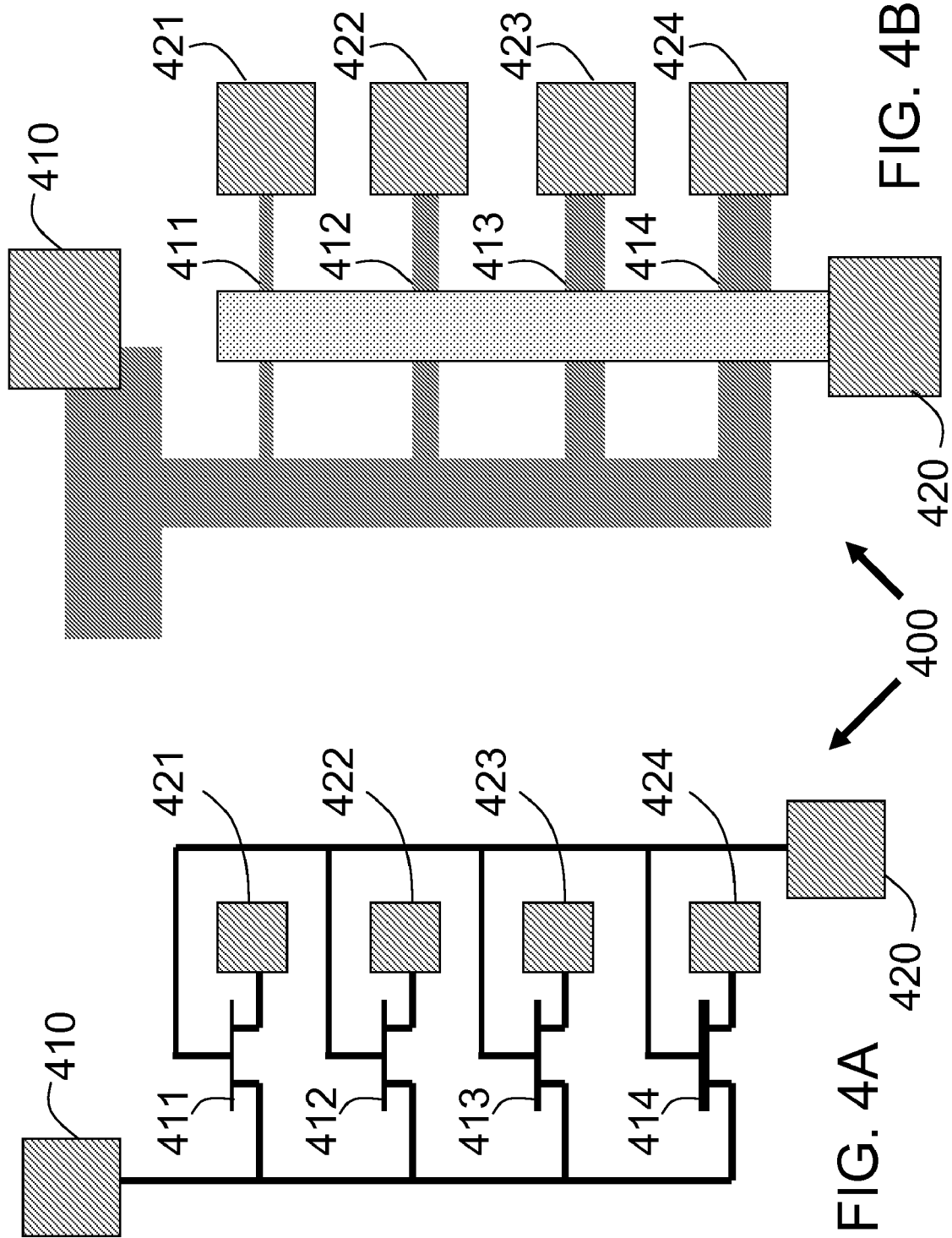
FIG. 4A and FIG. 4B are demonstrative illustrations of a test structure according to another embodiment of the present invention.

FIG. 4A is a demonstrative illustration of a test structure according to another embodiment of the present invention. Test structure 400 may include a set of transistors (e.g., NFET and/or PFET) 411, 412, 413 and 414, having different but pre-determined threshold voltages (VT) during operation.

FIG. 4B is an illustrative top view of one possible layout of the set of transistors shown in FIG. 4A. In FIGS. 4A and 4B, the number of transistors, four (4), are selected for illustration purpose only. A person skilled in the art will appreciate that the present invention is not limited in this respect and other number of transistors, such as six (6), eight (8), or ten (10), may be used as well.

A transistor usually comprises three regions including a source, a drain, and a gate. According to one embodiment, transistors 411, 412, 413, and 414 may be n-type transistors (e.g., NFET) and sources of transistors 411, 412, 413, and 414 may be connected in parallel to a common reference point 410, for example, a ground point. Drains of transistors 411, 412, 413, and 414 may be connected to a set of electron-collecting pads 421, 422, 423, and 424. According to another embodiment, transistors 411, 412, 413, and 414 may be p-type transistors (e.g., PFET) and drains of transistors 411, 412, 413, and 414 may be connected in parallel to common reference point 410 and sources of transistors 411, 412, 413, and 414 may be connected to the set of electron-collecting pads 421, 422, 423, and 424. In both embodiments gates of transistors 411, 412, 413, and 414 may be connected to a testing point 420, which may be an electron-collecting pad.

As is illustrated in FIG. 4B, transistors 411, 412, 413, and 414 may have different gate width, therefore resulting in different but pre-determined threshold voltages. By the virtue of surface electrons collected by the electron-collecting pad at testing point 420, and depending on the threshold voltages of individual transistors 411, 412, 413, and 414, during an inspection of integrated circuits, voltages at the gate of one or more transistors 411, 412, 413, and 414 may exceed their respective threshold, turn the transistor on, and result in electrons collected at corresponding electron-collecting pads to flow towards the common reference point 410. As a result, the corresponding electron-collecting pad may have a voltage potential that is close to that of common reference point 410.

For example, when the common reference point 410 is a ground (zero voltage) and when transistors 411 and 412 are turned on, conductive pads 421 and 422 may have a near zero voltage (or a voltage close to the voltage drop between source and drain of transistors 411 and 412) and may thus appear bright in an SEM image during a voltage contrast inspection. In other words, with the "turn-on" threshold voltages of transistors 411, 412, 413, and 414 pre-defined or pre-determined, the surface voltage of testing node 420, in the above example, may be determined to be above the threshold voltages of transistors 411 and 412 but below the threshold voltages of transistors 413 and 414 by simply identifying which conductive pad is bright. It shall be noted that a person skilled in the art will appreciate that although in the above example four transistors have been illustrated, the present invention is not limited in this respect and other numbers of transistors and corresponding electron-collecting pads may be used. For example, ten or more pairs of transistors and pads may be used to achieve a better resolution on the voltage collected by the testing node 420.

According to embodiments of the present invention, a set of testing structure 400 with different sizes of testing node 420 may be formed in a testing area or testing strip. The testing nodes of different sizes may hold different surface voltages, whose value may be determined by looking at the number of transistors that are turned on, to provide a map between brightness and voltages. The map may then be used to properly determine surface voltages of contacts and/or nodes of semiconductor devices under test. The surface voltages are in general associated with the quality of the contacts and/or nodes. A scheme of testing structure 400 generally provides a better sensitivity when compared with a scheme shown in FIG. 2, with the resolution not being limited by the minimum voltage drop across one diode. On the other hand, it generally requires more spaces in the testing area or testing strip since a plurality of such testing structures, like testing structure 400, may need to be fabricated.

Figure 5:
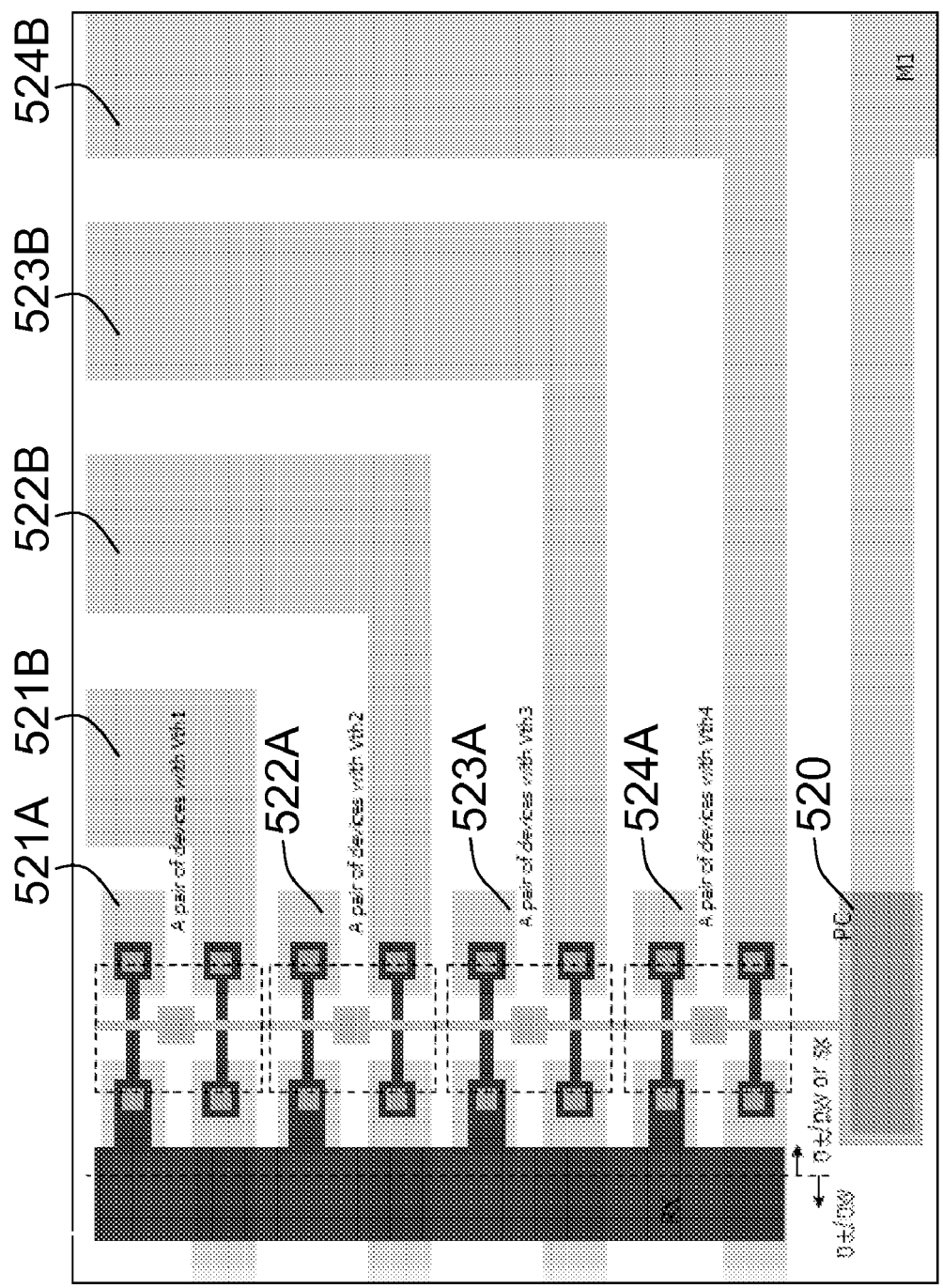
FIG. 5 is a demonstrative illustration of a test structure according to yet another embodiment of the present invention.

FIG. 5 is a demonstrative illustration of a test structure according to another embodiment of the present invention. Test structure 500 may include a plurality of groups of transistor/pad pair, such as for example groups 521, 522, 523, and 524, as well as a testing node 520. Each group, for example group 521, may include a first transistor/pad pair 521A and a second transistor/pad pair 521B. The first transistor/pad pair 521A may correspond to transistor 411 and electron-collecting pad 421 in FIG. 4. The second transistor/pad pair 521B may be supplemental to the first transistor/pad pair 521A to allow the threshold voltage of associated transistor to be measured and/or calibrated using an in-line or end of line tester. FIG. 5 may also include second group 522 having a first and a second transistor/pad pair 522A and 522B, third group 523 having a first and a second transistor/pad pair 523A and 523B, and fourth group 524 having a first and a second transistor/pad pair 524A and 524B. Although in FIG. 5, only four groups of transistor/pad pairs have been illustrated, the present invention is not limited in this respect and other numbers of groups of transistor/pad pairs may be used.

Figure 6:
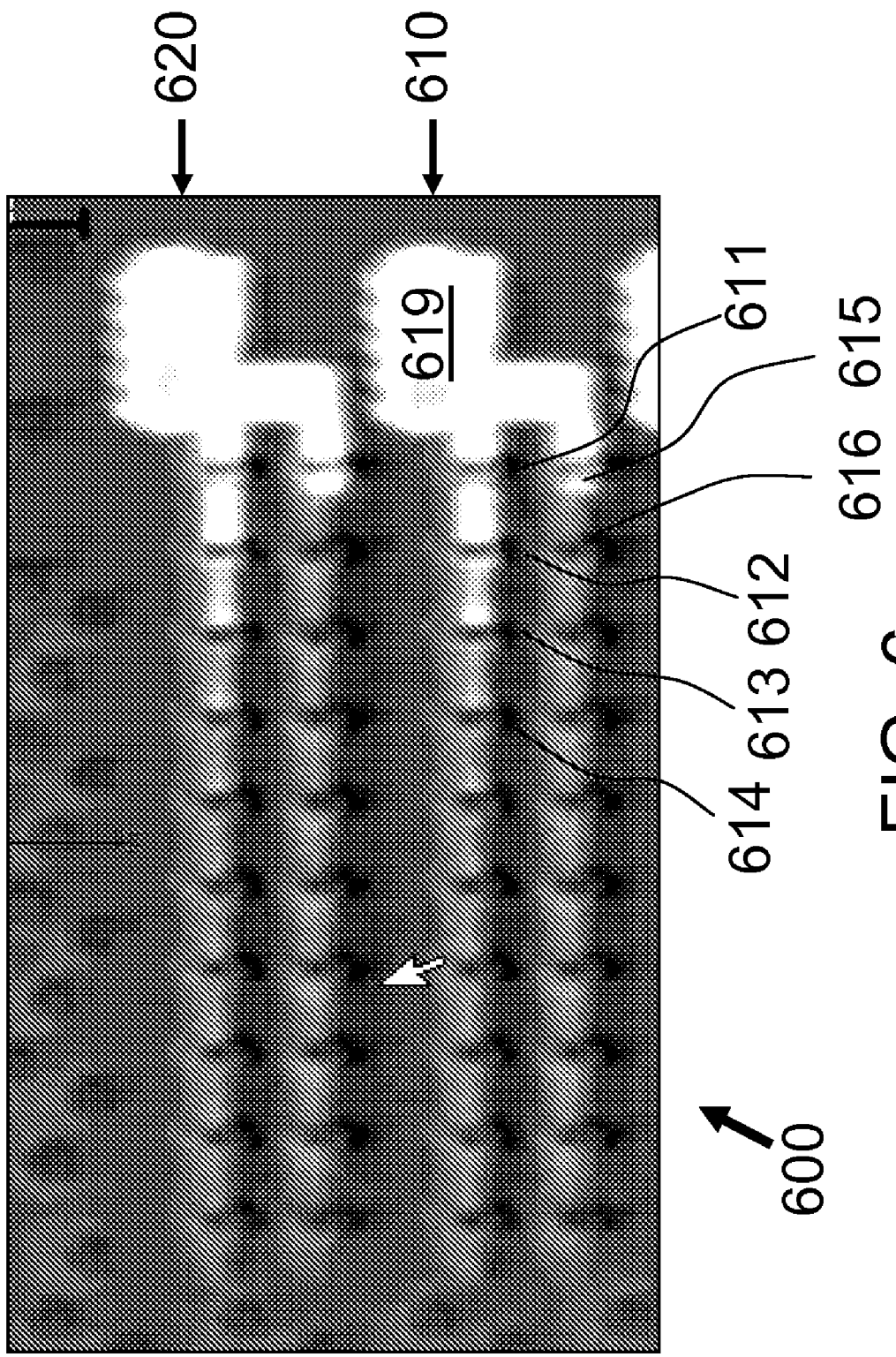
FIG. 6 is a sample SEM image using test structures according to one embodiment of the present invention.

FIG. 6 is a sample SEM image of a test structures according to one embodiment of the present invention. Test area 600 in FIG. 6 may include two test structures 610 and 620 and according to one embodiment of the present invention test structures 610 and 620 may be replicates of a same structure. Furthermore, test structure 610 may include a plurality of semiconductor diodes, for example, 611, 612, 613, 614, 615, and 616 which maybe semiconductor diodes as described above with regard to FIG. 2. The various spots of different brightness illustrate electron-collecting pads under different potentials with the biggest and brightest spot to the most right being a ground point 619. Diodes 611-614 are arranged to point in the direction of the ground 619; meaning anodes of diodes 611-614 are further away from ground point 619 than their respective cathodes. Because brightness of the electron-collecting pads represent surface voltages at locations between points 619 and 611, between points 611 and 612, between points 612 and 613, and between points 613 and 614, a person skilled in the art may appreciate that FIG. 6 provides a clear indication that the respective diodes are turned on and the voltage is different in each of these locations. To the left of diode 614, the brightness no longer changes suggesting the all the remaining electron-collecting pads are at the same or substantially the same voltage, which is between 2.4 and 1.8V based on the number of diodes that are on and the dropping voltage of each single diode being at 0.6V.

On the other hand, semiconductor diodes 615 and 616 are pointed away from ground point 619; meaning cathodes of diodes 615 and 616 are further away from ground 619 than their respective anodes. Diodes 615 and 616 may provide certain intensity mapping capability when electron retarding conditions, where a negative potential is induced on floating surface elements, occurs.

While the invention has been described in terms of exemplary embodiments, those skilled in the art will recognize that the invention can be practiced with modifications and in the spirit and scope of the appended claims.

What is claimed is:

1. A test structure fabricated together with one or more integrated circuits on a semiconductor wafer, said test structure comprising:

a common reference point for voltage reference;
a plurality of voltage dropping devices connected to said common reference point; and
a plurality of electron-collecting pads connected to a plurality of contact points, respectively, of said plurality of voltage dropping devices, a brightness shown by said plurality of electron-collecting pads during an inspection of said integrated circuits representing a pre-determined voltage at locations of said plurality of electron-collecting pads.

2. A test structure according to claim 1, wherein said common reference point is a ground point having a zero voltage during said inspection of said integrated circuits.

3. A test structure according to claim 2, wherein said plurality of voltage dropping devices are a group of diodes with said contact points being the anode thereof, said group of diodes being connected in a series with the cathode of a diode being connected to the anode of a preceding diode except a first diode in said series.

4. A test structure according to claim 3, wherein the cathode of said first diode is connected to said common reference point.

5. A test structure according to claim 1, wherein said plurality of voltage dropping devices are a group of transistors with a gate of said transistors being connected to either a source or a drain of said transistors, said transistors having a pre-determined voltage drop from the source to the drain of said transistors during operation.

6. A test structure according to claim 5, wherein said group of transistors being connected in a series with the drain of a transistor being connected to the source of an adjacent transistor.

7. A test structure according to claim 1, wherein said plurality of voltage dropping devices are a group of n-type field-effect-transistors (NFETs); sources of said NFETs being connected to said common reference point; drains of said NFETs being connected to said plurality of electron-collecting pads; and gates of said NFETs being connected to a common testing pad.

8. A test structure according to claim 1, wherein said plurality of voltage dropping devices are a group of p-type field-effect-transistors (PFETs); drains of said PFETs being connected to said common reference point; sources of said PFETs being connected to said plurality of electron-collecting pads; and gates of said PFETs being connected to a common testing pad.

9. A test structure fabricated upon a semiconductor wafer having one or more integrated circuits, said test structure comprising:
a common reference point for voltage reference;
a plurality of voltage dropping devices having respectively a first and a second contact points, said first contact point being associated with said common reference point, said voltage dropping devices being adapted to hold up to a certain pre-determined value of voltages between said first and said second contact points respectively; and
a plurality of conductive pads being connected respectively to said second points of said voltage dropping devices, said conductive pads being adapted to hold electronic charges and showing certain brightness representing said pre-determined voltages at locations of said plurality of electron-collecting pads during an inspection of said one or more integrated circuits.

10. A test structure according to claim 9, wherein said common reference point is a ground point having a pre-known voltage during said inspection of said one or more integrated circuits.

11. A test structure according to claim 10, wherein said plurality of voltage dropping devices are a group of semiconductor diodes connected in a series with said first contact point being the anode and said second contact point being the cathode thereof, and wherein the cathode of a diode being connected to the anode of a neighboring diode except the first diode in said series being connected to said common reference point.

12. A test structure according to claim 9, wherein said plurality of voltage dropping devices are a group of transistors with a gate being connected to a source or a drain depending on the type of said transistors, said transistors having a pre-determined voltage drop from the source to the drain during operation.

13. A test structure according to claim 12, wherein said group of transistors are connected in a series with the drain of a transistor being connected to the source of an adjacent transistor.

14. A structure, comprising:
a substrate having a ground point;
a plurality of semiconductor devices having respectively first and second contact points, said first contact points being associated with said ground point, said semiconductor devices being adapted to hold, up to a pre-determined set of values of, voltages between said first and said second contact points; and
a plurality of conductive pads being connected to said second contact points of said semiconductor devices respectively, said conductive pads being adapted to collect electronic charges and showing certain brightness representing said pre-determined voltages at locations of said plurality of electron-collecting pads during an inspection of one or more integrated circuits.

15. The structure of claim 14, wherein one or more of said plurality of semiconductor devices are semiconductor diodes having an anode and a cathode respectively, said semiconductor diodes having a pre-determined threshold voltage from said anode to said cathode during operation.

16. The structure of claim 14, wherein one or more of said plurality of semiconductor devices are semiconductor transistors having a gate, a source, and a drain, said gate being connected to said source, wherein said semiconductor transistors being adapted to provide certain voltage drops between said source and said drain when being turned on.

17. A test structure according to claim 14, wherein said plurality of voltage dropping devices are a group of diodes and said first and second contact points being the anode and cathode thereof respectively, said group of diodes being connected in a series with the cathode of a diode being connected to the anode of a neighboring diode.

18. A test structure according to claim 17, wherein the cathode of a first diode in said series is connected to said common reference point.

19. A test structure according to claim 14, wherein said plurality of voltage dropping devices are a group of transistors and a gate of said transistors being connected to a source or a drain of said transistors, said transistors having a pre-determined voltage drop from the source to the drain of said transistors during operation.

20. A test structure according to claim 19, wherein said group of transistors being connected in a series with the drain of a transistor being connected to the source of an adjacent transistor.

* * * * *